(12) United States Patent
Hikosaka (10) Patent No.: US 6,743,647 B2
(45) Date of Patent: Jun. 1, 2004

(54) SEMICONDUCTOR MEMORY DEVICE MANUFACTURING METHOD

(75) Inventor: Yukinobu Hikosaka, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/359,223

(22) Filed: Feb. 6, 2003

(65) Prior Publication Data

US 2004/0043522 A1 Mar. 4, 2004

(30) Foreign Application Priority Data

Aug. 29, 2002 (JP) .................................... 2002-251953

(51) Int. Cl.[7] ............................................... H01L 21/66
(52) U.S. Cl. ........................................................ 438/18
(58) Field of Search ............................. 438/14, 18, 241

(56) References Cited

U.S. PATENT DOCUMENTS 6,623,986 B2 * 9/2003 Ogata et al. .................. 438/3

FOREIGN PATENT DOCUMENTS

JP          11-176195          7/1999

* cited by examiner

*Primary Examiner*—David Nelms
*Assistant Examiner*—Quoc Hoang
(74) *Attorney, Agent, or Firm*—Westerman, Hattori, Daniels & Adrian, LLP

(57) ABSTRACT

A method of the present invention of manufacturing a semiconductor memory device provided with a capacitor over a semiconductor substrate, which has a lamination of a lower electrode made of a first conductive film, a capacitor dielectric film made of a dielectric film, and an upper electrode made of a second conductive film, comprises the steps of forming an insulating film, forming a capacitor on the insulating film, forming a dielectric monitor that is made of same material and has a same layer structure as the capacitor on the insulating film, measuring characteristics of the dielectric monitor in middle of a step of forming the capacitor, and evaluating the capacitor based on measured results of the characteristics of the dielectric monitor.

24 Claims, 9 Drawing Sheets

SEMICONDUCTOR MEMORY DEVICE MANUFACTURING METHOD

CROSS-REFERENCE TO RELATED APPLICATIONS

This application is based upon and claims priority of Japanese Patent Application No. 2002-251953, filed on Aug. 29, 2002, the contents being incorporated herein by reference.

BACKGROUND OF THE INVENTION

1. Field of the Invention

The present invention relates to a semiconductor memory device manufacturing method and, more particularly, a method of manufacturing a nonvolatile semiconductor memory using ferroelectric material as a capacitor dielectric film (FeRAM: Ferroelectric Random Access Memory).

2. Description of the Prior Art

After the memory chip of FeRAM has been manufactured, the monitor test and the device test are carried out in order to decide whether or not the chip can be delivered.

Figure 1:
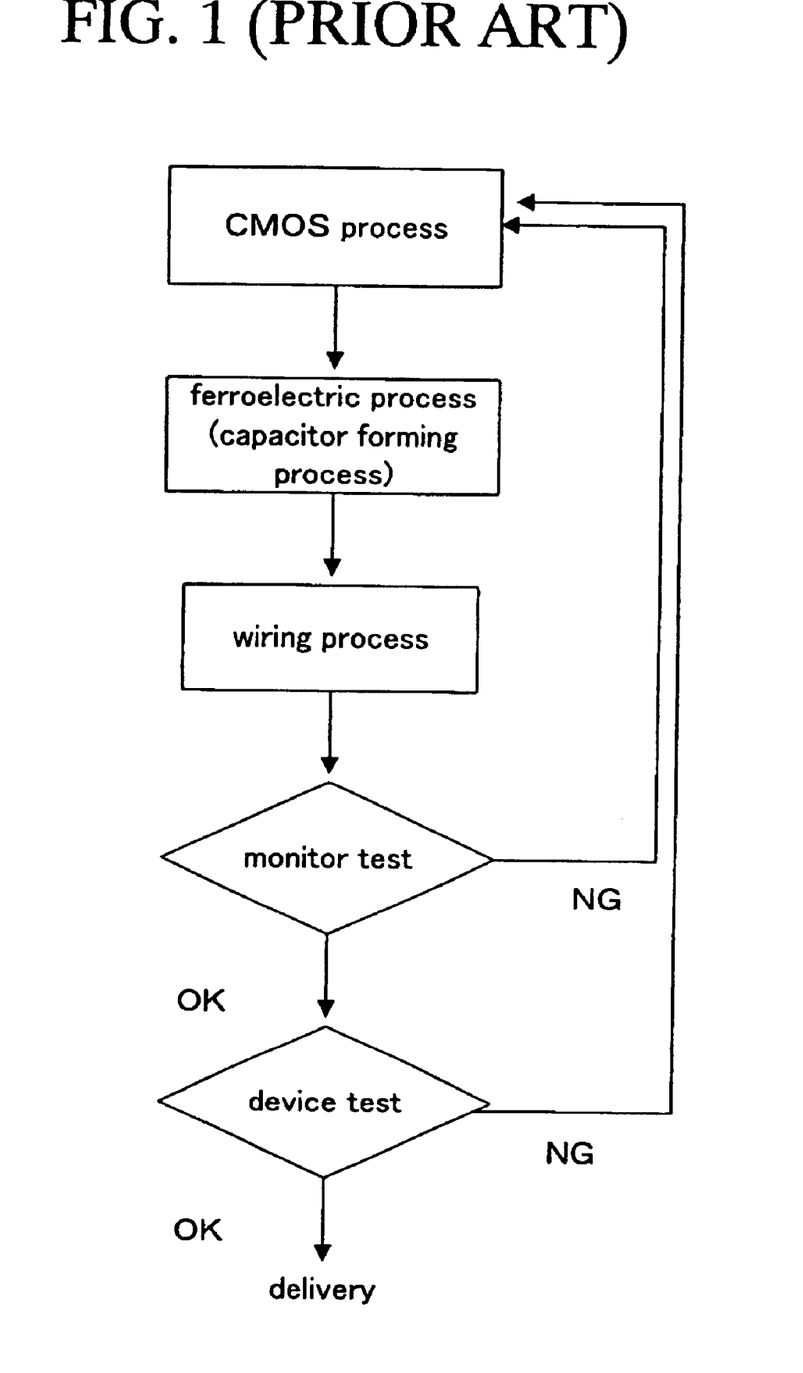
FIG. 1 is a flowchart showing steps of manufacturing a semiconductor memory device in the prior art.

FIG. 1 is a flowchart showing FeRAM manufacturing steps containing these tests.

The FeRAM chip is completed by executing sequentially the CMOS process of forming the control MOS transistor, the ferroelectric process of forming the ferroelectric capacitor over the control MOS transistor, and the wiring process of forming the wirings over the capacitor. Then, the monitor test as the first delivery decision test and the device test as the second delivery decision test are executed successively in the wafer state. Then, if the chip is decided as the defective in the monitor test or the device test, the wafer having the chip is dumped or the manufacture is started over again from the first CMOS process.

The monitor test is performed by using the cell test pattern connecting circuit elements each having the same structure as the main chip in parallel, and measuring transistor characteristics, contact resistance, wiring resistance, interwiring leakage, ferroelectric capacitor characteristics, etc. Such chip is defined as the non-defective if these measured values are within the criteria, but such chip is defined as the defective if these measured values are out of the criteria.

The ferroelectric capacitor characteristics out of the above measurement items are the ferroelectric capacitor characteristics such as an amount of residual dielectric polarization ($Q_{SW}$), an amount of effective residual dielectric polarization ($Q_{eff}$), saturation voltage (V90), capacitor leakage current ($L_{cap}$), capacitor capacitance ($C_{cap}$), and the like. These measurement items are measured by using the cell test pattern as set forth in Patent Application Publication (KOKAI) Hei 11-176195. These measurement items are particularly effective to evaluate the results such as crystallinity and composition of the ferroelectric substance, etc.

The device test is composed of the direct current test for measuring operation states of the input protection circuit, the alternating current test for measuring operation states of peripheral circuits and all the cells, and the retention test for checking whether or not data of the ferroelectric capacitor can be held. Test results are evaluated in accordance with predetermined criteria to define whether or not the chip is the non-defective or the defective.

Meanwhile, in FeRAM, particularly the ferroelectric capacitor characteristics are important and also yield of the retention test is important because FeRAM is the nonvolatile memory. The ferroelectric capacitor forming step is the most important process to affect the ferroelectric capacitor characteristics and the retention performance (data retention capability).

However, even if any trouble is present in the ferroelectric capacitor forming step, the FeRAM must be completed by executing the manufacturing steps up to the final step, in order to make the above delivery decision in the prior art. Therefore, if the device is defined as the defective according to the result of test, reduction in yield is brought about and also man-hours needed for executing the manufacturing steps are totally wasted, so that throughput is lowered. Under such circumstances, it is desired that, if there is any trouble in the intermediate steps, the delivery decision should be made in the early stage without executing the steps until the final manufacturing step.

SUMMARY OF THE INVENTION

It is an object of the present invention to provide a semiconductor memory device manufacturing method capable of achieving improvement of yield and improvement of throughput by feeding back trouble to the manufacturing steps in its early stage if such trouble is caused in the middle of manufacturing steps.

A semiconductor memory device manufacturing method of the present invention, in the method of manufacturing a semiconductor memory device provided with a capacitor over the semiconductor substrate, which has a laminated structure of a lower electrode made of a first conductive film, a capacitor dielectric film made of a dielectric film, and an upper electrode made of a second conductive film, is characterized in comprising the steps of forming an insulating film over the semiconductor substrate; forming a capacitor on the insulating film; forming a dielectric monitor, which is made of same material and has a same layer structure as the capacitor, on the insulating film; measuring characteristics of the dielectric monitor in middle of a process of forming the capacitor; and evaluating the capacitor based on measured results of the characteristics of the dielectric monitor.

Meanwhile, in the situation that, when process failure is caused in forming the capacitor, an amount of residual dielectric polarization does not satisfy the criterion, it is desired to decide immediately in the relevant step whether or not the in-process wafer should be abandoned or such wafer should be reproduced. However, in the prior art, the delivery decision is made by the monitor test or the device test after all manufacturing steps have been completed. Therefore, if the wafer is reproduced, the reproducing operation becomes complicated to bring about reduction in the yield. Also, wasteful man-hours are consumed in the subsequent manufacturing steps after the relevant step in which the trouble is generated, and thus reduction in throughput is brought about.

The present invention comprises the step of forming the dielectric monitor in addition to the step of forming the capacitor. And it further comprises the step of measuring the characteristics of the dielectric monitor in the middle of the process of forming the capacitor, and the step of evaluating the capacitor based on measured results of the characteristics of the dielectric monitor.

Since the characteristics of the dielectric monitor are measured in the middle of the process of forming the capacitor, the abnormality of crystallinity, composition, etc. of the dielectric film can be detected via the measured value of the capacitor characteristics such as the amount of residual dielectric polarization ($Q_{SW}$), etc. Therefore, before completion of the formation of the capacitor, the evaluation of the capacitor can be made to decide in the early stage whether or not the capacitor forming step should be continued, or the concerned wafer should be abandoned, or the step should go back to the step of reproducing the capacitor. Even if the failure is caused in the capacitor forming process, the evaluation can lead to elimination of wasteful man-hours in the subsequent manufacturing steps after the relevant step in which the failure is caused, and thus improvement in throughput can be achieved. In addition, if the reproduction is selected, merely the defective manufacturing step is required as the reproducing operation, and thus the reproducing operation can be simplified and also improvement in yield can be achieved.

Also, the yield of the retention characteristics of the capacitor, etc. can be predicted via the measured values of the capacitor characteristics such as an amount of residual dielectric polarization ($Q_{SW}$), etc. Therefore, only the in-process wafers with high yield can be shifted selectively to later steps, and thus improvement in the device yield can be achieved.

DESCRIPTION OF THE PREFERRED EMBODIMENT

An embodiment of the present invention will be described with reference to the drawings hereinafter.

Explanation of a Semiconductor Memory Device Manufacturing Method

Figure 3:
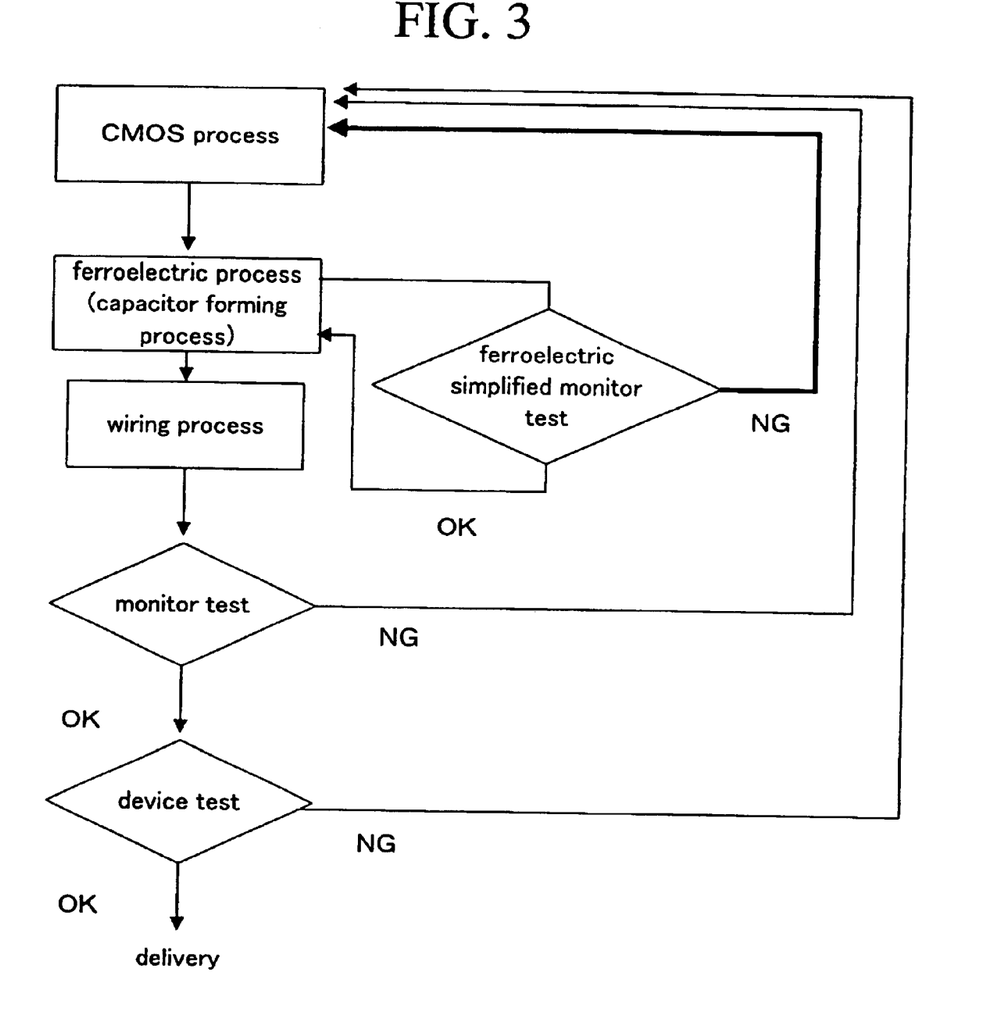
FIG. 3 is a flowchart showing steps of manufacturing the semiconductor memory device according to the embodiment of the present invention.
Figure 4A:
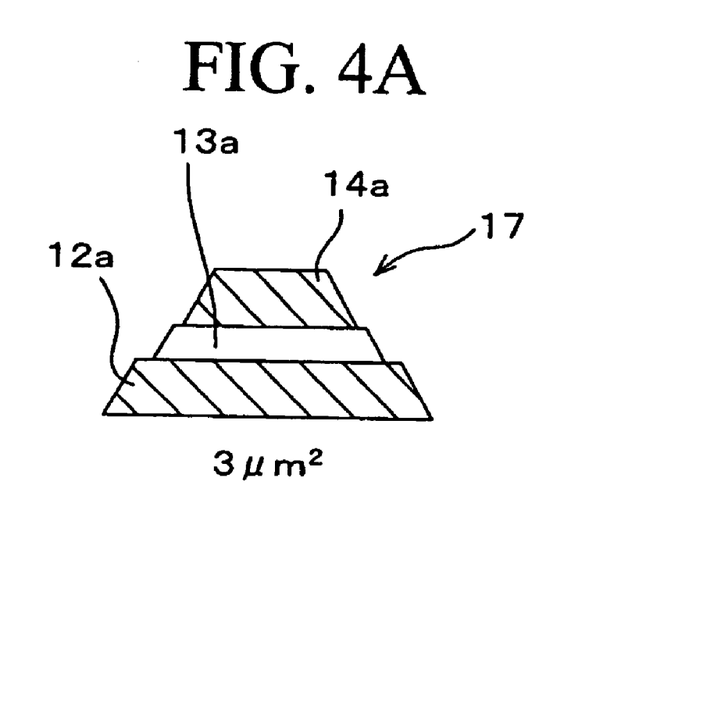
FIG. 4A is a sectional view of a capacitor of the semiconductor memory device according to the embodiment of the present invention.
Figure 4B:
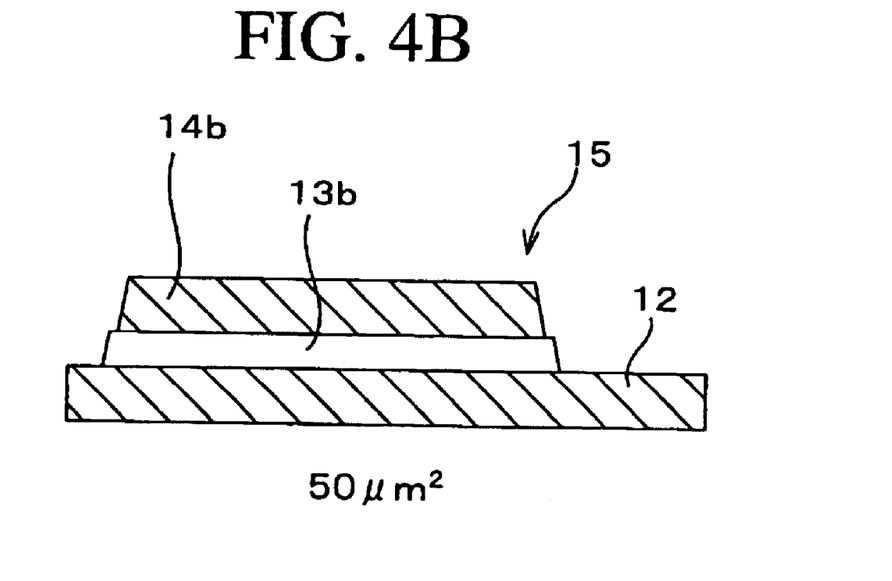
FIG. 4B is a sectional view of a dielectric monitor of the semiconductor memory device according to the embodiment of the present invention.

FIGS. 2A to 2G are sectional views in the bit-line extending direction showing steps of manufacturing a semiconductor memory device (FeRAM) according to an embodiment of the present invention. The left side view shows a memory area A and the right side view shows a monitor area B. FIG. 4A and FIG. 4B are sectional views showing a capacitor and a dielectric monitor respectively. Also, FIG. 3 is a flowchart showing steps of manufacturing the semiconductor memory device according to the embodiment of the present invention.

In this case, a cell test pattern is formed in the monitor area together with formation of the circuit elements of the main chip. The cell test pattern is composed of a parallel connection of circuit elements each having the same structure as a main chip. But its further explanation will be omitted hereinafter.

Figure 2A:
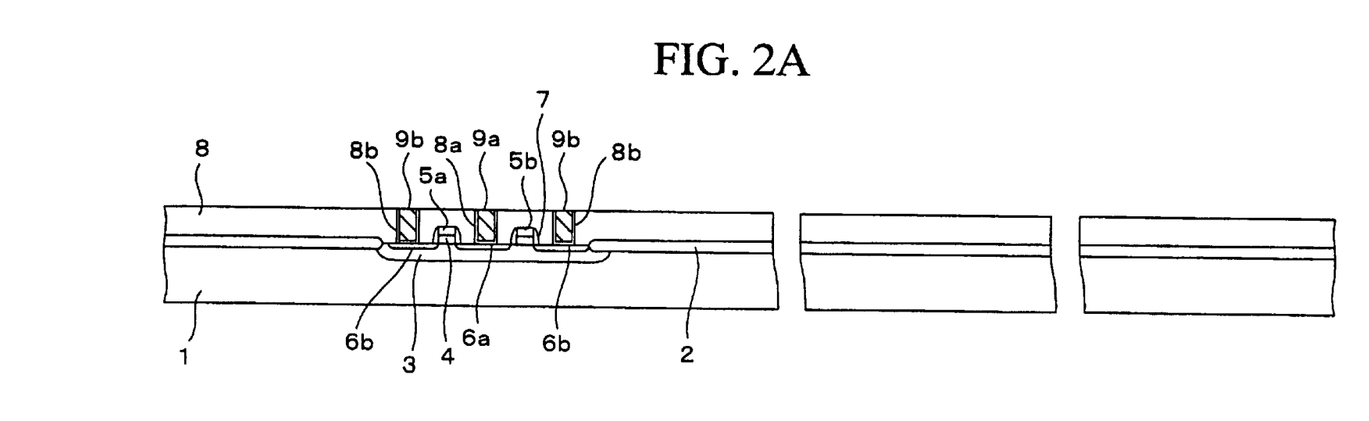
FIGS. 2A to 2G are sectional views in the bit-line extending direction showing steps of manufacturing a semiconductor memory device according to an embodiment of the present invention.

First, the explanation will describe hereunder so-called CMOS steps required until a sectional structure shown in FIG. 2A is obtained.

In FIG. 2A, an element isolation insulating film 2 is formed on a surface of a p-type silicon substrate (semiconductor substrate) 1 by the LOCOS (Local Oxidation of Silicon) method. In this case, as the element isolation insulating film 2, STI (Shallow Trench Isolation) may be employed in addition to a silicon oxide film formed by the LOCOS method.

After formation of such element isolation insulating film 2, a first p-well 3 is formed in an active region of the memory area A by introducing selectively the p-type impurity and the n-type impurity into the memory area A of the silicon substrate 1. Also, a second p-well (not shown) is formed in the neighborhood of the region being subject to a formation of the capacitor of the memory area A.

Then, a silicon oxide film used as a gate insulating film 4 is formed by thermally oxidizing surfaces of respective active regions of the silicon substrate 1.

Then, an amorphous silicon film and a tungsten silicide film are formed sequentially on the overall surface of the silicon substrate 1 to cover the element isolation insulating film 2 and the gate insulating film 4. Then, the amorphous silicon film and the tungsten silicide film are patterned into a predetermineded shape by the photolithography method. Thus, gate electrodes 5a, 5b are formed in the active region and also a leading wiring (not shown) is formed on the element isolation insulating film 2.

In the memory area A, two gate electrodes 5a, 5b are arranged in almost parallel on the first p-well 3. These gate electrodes 5a, 5b serve as the word line WL that extends onto the element isolation insulating film 2.

In this case, a polysilicon film may be formed in place of the amorphous silicon film constituting the gate electrodes 5a, 5b.

Then, n-type impurity diffusion regions 6a, 6b serving as source/drain of the n-channel MOS transistor are formed by ion-implanting the n-type impurity into the first p-well 3 in the memory area A on both sides of the gate electrodes 5a, 5b.

Then, an insulating film is formed on the overall surface of the silicon substrate 1. Then, sidewall insulating films 7 are left on both side portions of the gate electrodes 5a, 5b by etching back the insulating film. The insulating film is made of, for example, a silicon oxide ($SiO_2$) film formed by the CVD method.

Then, a silicon oxide nitride (SiON) film (not shown) may be formed as a cover film on the overall surface of the silicon substrate 1 by the plasma enhanced CVD method.

Then, a silicon oxide ($SiO_2$) film is deposited to a thickness of about 1.0 μm by the plasma enhanced CVD method using a TEOS gas. This silicon oxide film is used as a first interlayer insulating film 8.

Then, in order to densifying the first interlayer insulating film 8, such first interlayer insulating film 8 is annealed at the temperature of 700° C. for 30 minute in the atmospheric-pressure nitrogen atmosphere. Then, an upper surface of the first interlayer insulating film 8 is planarized by polishing the first interlayer insulating film 8 by the CMP (Chemical Mechanical Polishing) method.

Then, the first interlayer insulating film 8 is patterned by the photolithography method so as to form holes 8a, 8b having a depth that reaches the n-type impurity diffusion regions 6a, 6b respectively. Then, a Ti (titanium) film of 20 nm thickness and a TiN (titanium nitride) film of 50 nm thickness are formed sequentially on the upper surface of the first interlayer insulating film 8 and in the holes 8a, 8b by the sputter method. Then, a W (tungsten) film is deposited on the TiN film by the CVD method to have a thickness that can bury perfectly the holes 8a, 8b.

Then, the W film, the TiN film, and the Ti film are polished sequentially by the CMP method until the upper surface of the first interlayer insulating film 8 is exposed. After this polishing, the W film, etc. left in the holes 8a, 8b serves as contact plugs 9a, 9b.

In the first p-well 3 in the memory area A, the bit line, as described later, is connected to the first contact plug 9a formed on the n-type impurity diffusion region 6a, which is put between two gate electrodes 5a, 5b. Then, the capacitor upper electrodes, as described later, are connected to two remaining second contact plugs 9b.

In this case, after a formation of the holes 8a, 8b, the impurity may be ion-implanted into the n-type impurity diffusion region 6a, 6b to compensate the contact.

Then, the explanation will describe hereunder the capacitor forming step containing the simplified monitor test, so-called ferroelectric process. In this case, the cell test pattern is also formed in the monitor area. The cell test pattern is composed of a parallel connection of a plurality of ferroelectric capacitors which respectively have the same shape as the ferroelectric capacitor of the memory. But its further explanation will be omitted herein.

The reason why a dielectric monitor is newly provided without employing the cell test pattern for the simplified monitor test is to make measurement possible while bringing a needle-like electrode into direct contact with an electrode of the monitor. In contrast, since the cell test pattern is as small in size as the capacitor in the memory area A, the measurement is difficult as it is and therefore a leading electrode for the measurement must be newly formed.

Figure 2B:
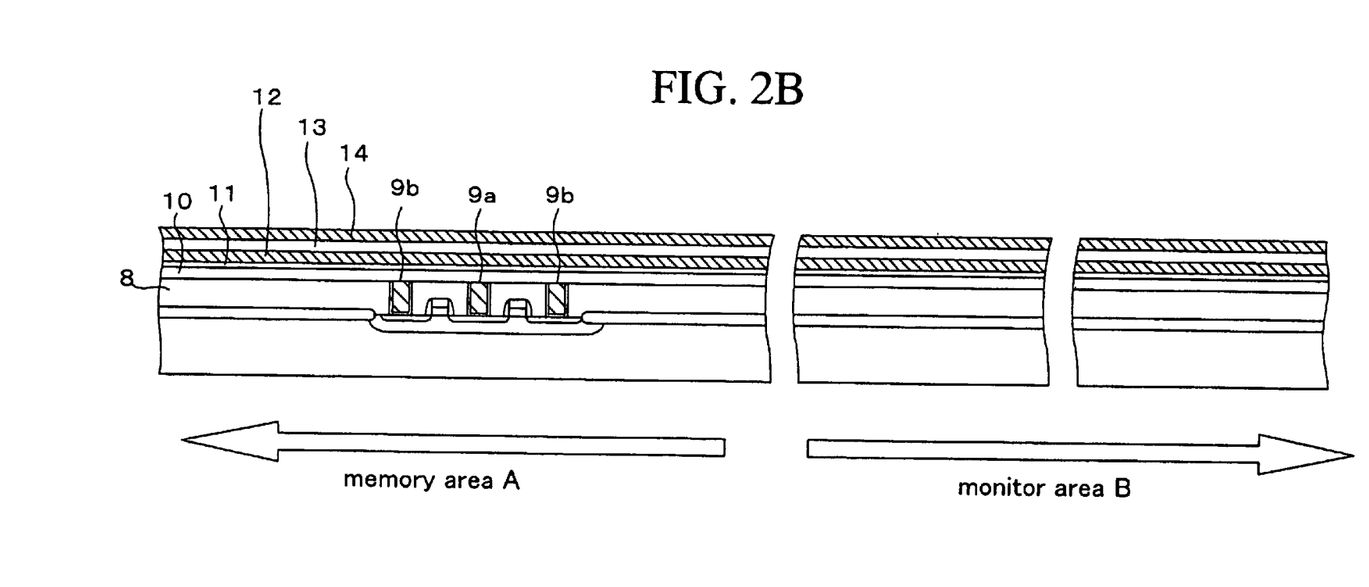

First, as shown in FIG. 2B, in order to prevent the oxidation of the contact plugs 9a, 9b, a SiON film 10 of 100 nm thickness is formed on the first interlayer insulating film 8 and the contact plugs 9a, 9b by the plasma enhanced CVD method using silane ($SiH_4$). Then, a $SiO_2$ film 11 of 150 nm thickness is formed on the SiON film 10 by the plasma enhanced CVD method using TEOS and oxygen as the reaction gas. In this case, the SiON film 10 has also a function of preventing moisture from permeating into the first interlayer insulating film 8.

Then, in order to densify the SiON film 10 and the $SiO_2$ film 11, these films are annealed at the temperature of 650° C. for 30 minute in the atmospheric-pressure nitrogen atmosphere.

Then, a Ti film and a Pt (platinum) film are formed sequentially on the $SiO_2$ film 11 to form a first conductive film 12 having a double-layered structure. The Ti film and the Pt film are formed by the DC sputter method.

In this case, a thickness of the Ti film is set to about 10 to 30 nm and a thickness of the Pt film is set to about 100 to 300 nm. For example, the thickness of the Ti film is set to 20 nm and the thickness of the Pt film is set to 175 nm. Here, the first conductive film 12 may be formed of a film made of iridium, ruthenium, ruthenium oxide, iridium oxide, strontium ruthenium oxide ($SrRuO_3$), or the like.

Then, the first conductive film 12 is thereon subject to a formation of a dielectric film 13 with a thickness of 100 to 300 nm, for example, 200 nm by the RF sputter method. The dielectric film 13 is made of lead zirconate titanate (PZT; $Pb(Zr_{1-x}Ti_x)O_3$) of ferroelectric material.

Then, in order to crystallize PZT constituting the dielectric film 13, RTA (Rapid Thermal Annealing) is executed at the temperature of 650 to 850° C. for 30 to 120 second in the oxygen atmosphere. For example, the annealing is executed at the temperature of 700° C. for 60 second.

As the ferroelectric material forming method, there are the spin-on method, the sol-gel method, the MOD (Metal Organic Deposition) method, and the MOCVD method, in addition to the above sputter method. Also, as the ferroelectric material, there are lead lanthanum zirconate titanate (PLZT), $SrBi_2(Ta_xNb_{1-x})_2O_9$ (where $0<x<1$), $Bi_4Ti_3O_{12}$, etc., in addition to PZT. In this case, if DRAM is manufactured instead of FeRAM, the high-dielectric material such as $(BaSr)TiO_3$ (BST), strontium titanate (STO), or the like may be employed in place of the above ferroelectric material.

Then, an iridium oxide ($IrO_2$) film of 100 to 300 nm thickness is formed as a second conductive film 14 on the dielectric film 13 by the sputter method. For example, a thickness of the second conductive film 14 is set to 200 nm. In this case, platinum or strontium ruthenium oxide (SRO) may be employed as the second conductive film 14.

Figure 2C:
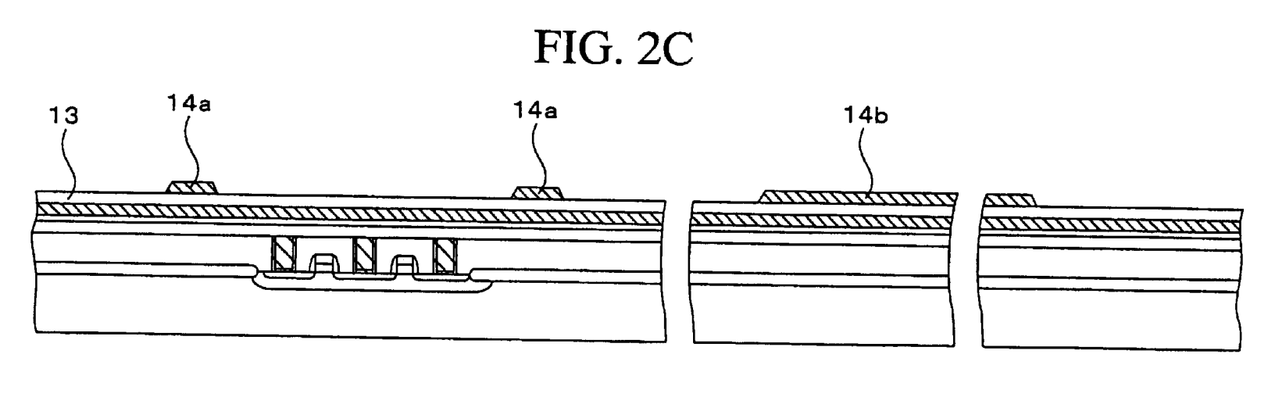

Then, as shown in FIG. 2C, the second conductive film 14 is patterned to form a plurality of capacitor upper electrodes 14a in the memory area A. The capacitor upper electrode 14a are aligned vertically and laterally along the extending direction of the word line WL and the extending direction of the bit line described later. The capacitor upper electrode 14a has a size of 1.6 $\mu m \times 1.9$ $\mu m$, and an area thereof is approximately 3 $\mu m^2$. The capacitor upper electrodes 14a are formed in vicinity of the p-wells 3 as many as the MOS transistors that are formed in the memory area A.

At this time, upper electrodes 14b of the dielectric monitors are formed in the monitor area B simultaneously. The upper electrode 14b of the dielectric monitor has a size of 50 $\mu m \times 50$ $\mu m$, and an area thereof is approximately 2500 $\mu am^2$.

Figure 2D:
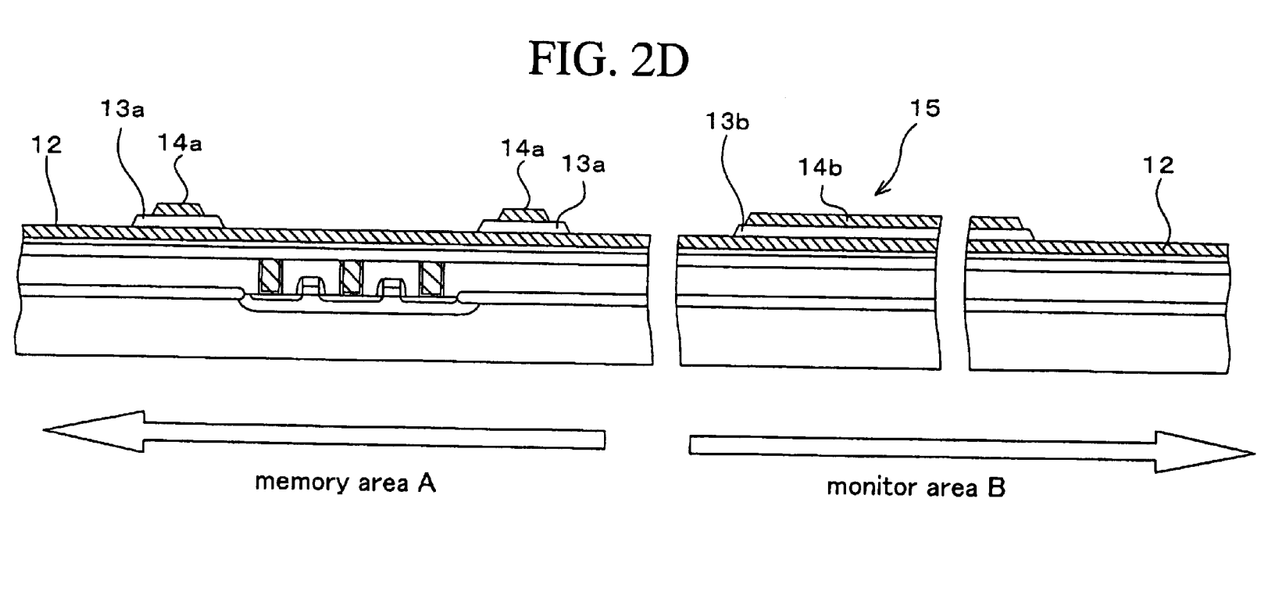

Then, as shown in FIG. 2D, the dielectric film 13 is patterned to form capacitor dielectric films 13a made of stripe-like dielectric films. The stripe-like dielectric films continuously extends in the word-line WL direction under a plurality of capacitor upper electrodes 14a. At this time, the patterning brings into a formation of monitor dielectric films of the dielectric monitors made of patterned dielectric films 13b simultaneously. The completion of this step results in a formation of a dielectric monitor 15, which has the not-patterned first conductive film 12 as a first electrode, the patterned dielectric film as a monitor dielectric film 13b, and the patterned second conductive film as a second electrode 14b. A sectional structure of the dielectric monitor 15 is shown in FIG. 4B. A protection insulating film 16 is omitted from FIG. 14. In this case, since the patterning of the first conductive film 12 is not executed, the capacitor lower electrode has not been formed yet and thus the capacitor is in the midway to the completion.

Next, the explanation will describe hereunder the simplified monitor test using the dielectric monitor 15 shown in FIG. 2D. According to the simplified monitor test in this embodiment, a measurement is to be performed with respect to an amount of residual dielectric polarization ($Q_{SW}$) in the monitor. The $Q_{SW}$ in the monitor has led to confirmation of correlations with an amount of residual dielectric polarization ($Q_{SW}$) in the memory area A and yield of the retention characteristic of the capacitor. These correlation data will be explained in the following "Explanation of measurement items and evaluation items that can be evaluated by the measurement items".

Figure 2E:
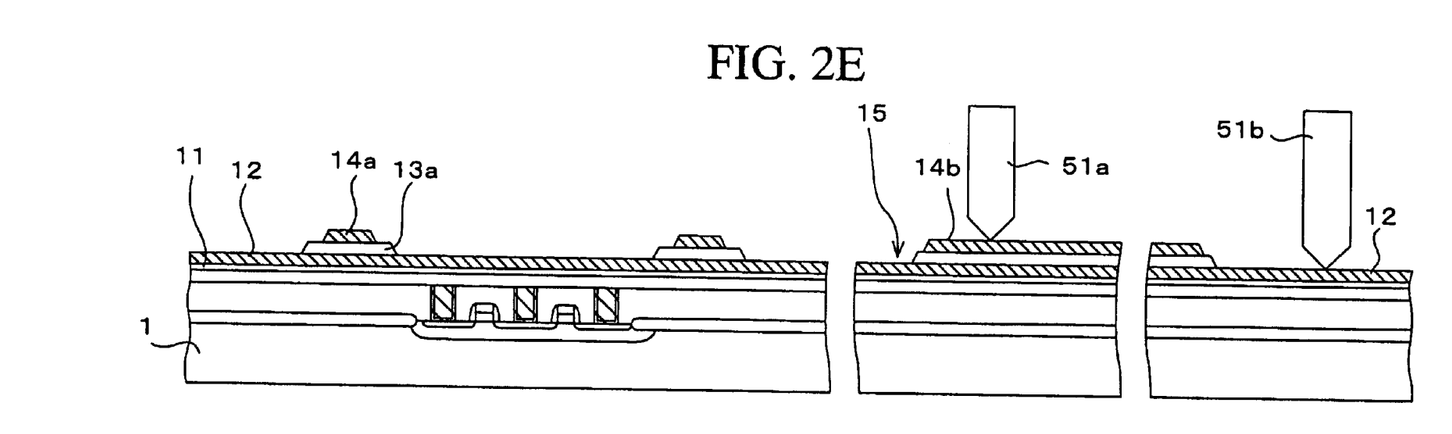

The measuring circuit is the well-known sawyer-tower circuit. More particularly, as shown in FIG. 2E, needle-like electrode 51a, 51b are brought into contact with the second electrode 14b of the dielectric monitor 15 and the first electrode 12 respectively, and also the pulse generator is connected to the first electrode 12 and a load capacitor is connected to the second electrode 14b. The load capacitor corresponds to a capacitor having a capacitance value of 5.6 nF. At the time of measurement, the pulse generator supplies a pulse having a pulse width of 1 µs and a voltage of 5 V. More detailed explanation of the measuring method is set forth in S. D. TRAYNOR, T. D. HANDNAGY and L. KAMMERDINER, Integrated Ferroelectrics, 1997, Vol.16, pp.63–76, etc.

In this manner, an amount of residual dielectric polarization ($Q_{SW}$) in the dielectric monitor 15 is measured and then is compared with a predetermined reference value (lower limit) of an amount of residual dielectric polarization ($Q_{SW}$) in the dielectric monitor 15.

Then, if the reference value is not satisfied with respect to a measured amount of residual dielectric polarization ($Q_{SW}$) in the dielectric monitor 15, the concerned wafer is abandoned and the new wafer (to which the CMOS step has already been applied) is prepared and then the step is restarted from the ferroelectric process, otherwise the concerned wafer is not abandoned and the capacitor is reproduced. If the capacitor is reproduced, the capacitor upper electrode 14a and the capacitor dielectric film 13a are removed and then the dielectric film 13 and the second conductive film 14 are formed newly on the not-patterned first conductive film. Then, the evaluation of the capacitor dielectric film 13a is executed once again via the steps in FIG. 2C to FIG. 2E. These steps are repeated until the reference value can be satisfied with respect to a measured amount of residual dielectric polarization ($Q_{SW}$) in the dielectric monitor 15.

Meanwhile, if the reference value is satisfied with respect to a measured amount of residual dielectric polarization ($Q_{SW}$) in the dielectric monitor 15, the dielectric film 13 of the capacitor is defined as a normal formation. Then, the step goes to the subsequent step. That is, a capacitor lower electrode 12a is formed by patterning the first conductive film 12 that has not been patterned yet. Next, these steps will be explained hereunder.

First, in order to remove the contamination such as particles, etc. that are brought about on the chip by the contact of the needle-like electrodes 51a, 51b after the simplified monitor test is carried out, the scrubber process is executed.

Then, the silicon substrate is put in the oxygen atmosphere, and then the pre-process annealing is applied by heating the silicon substrate at the substrate temperature of 350° C. for 60 minute.

Then, the protection insulating film 16 made of alumina of 20 to 100 nm thickness, for example, 50 nm thickness is formed on the capacitor upper electrodes 14a, the capacitor dielectric films 13a, and the first conductive film 12, shown in FIG. 2E, by the RF sputter equipment. The alumina is formed in the atmosphere having the pressure of 7.5 mTorr while setting the RF power to 2 kW, for example.

Figure 2F:
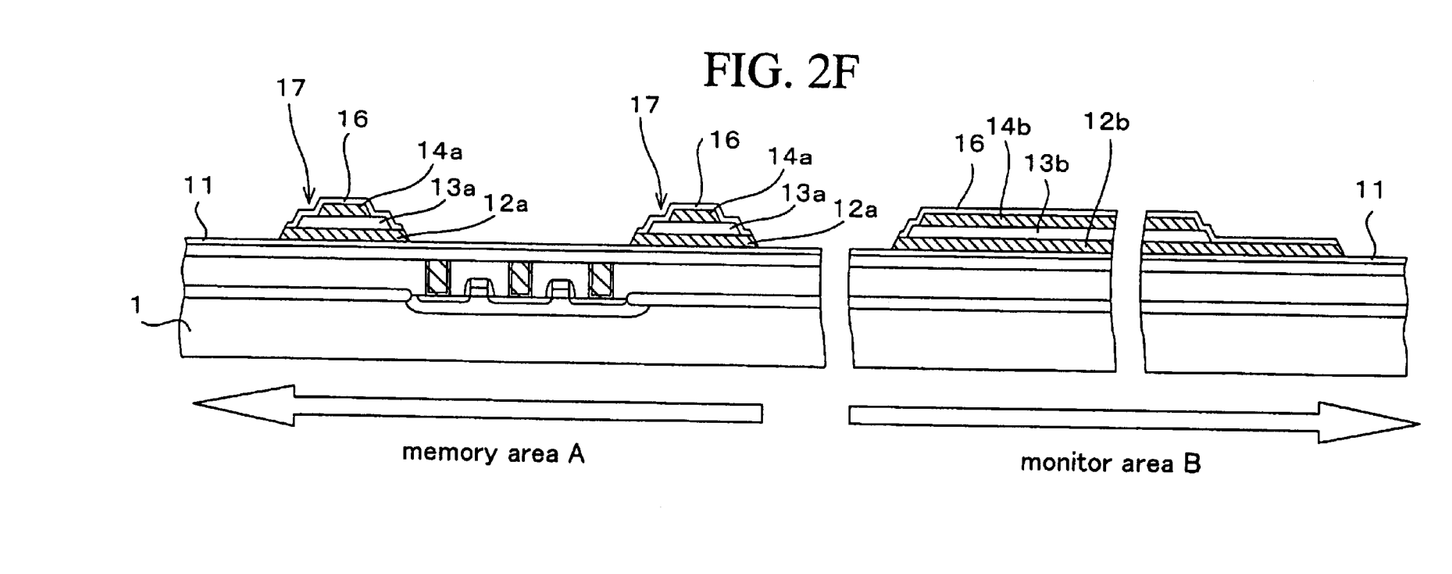

Then, stripe-like resist patterns (not shown) are formed on the protection insulating film 16. The stripe-like resist patterns cover the capacitor dielectric films 13a and the capacitor upper electrodes 14a in the word line WL direction. Then, the protection insulating film 16 and the first conductive film 12 are etched sequentially by using the resist patterns as a mask. Accordingly, as shown in FIG. 2F, that performance results in a formation of the capacitor lower electrodes 12a that are also used as wirings, which pass through under a plurality of capacitor dielectric films 13a. At this time, the first conductive film 12 of the dielectric monitor is also patterned to form a patterned first electrode 12b of the dielectric monitor.

The lower electrode 12a has a contact area that is protruded from the stripe-like dielectric film 13a. Also, the protection insulating film 16 has a shape that cover the capacitor upper electrodes 14a, the capacitor dielectric films 13a, and the capacitor lower electrodes 12a from the upper side. After the capacitor lower electrodes 12a are patterned, the silicon substrate 1 is put in the oxygen atmosphere and then the process of improving the film quality of the capacitor dielectric films 13a and the monitor dielectric films 13b is applied at the substrate temperature of 650° C. for 60 minute.

A ferroelectric capacitor 17 is constituted by the capacitor lower electrode 12a, the capacitor dielectric film 13a, and the capacitor upper electrode 12a formed according to above steps. A sectional structure of the ferroelectric capacitor 17 is shown in FIG. 4A. In this case, the protection insulating film 16 is omitted from FIG. 4A. In the memory area A, the ferroelectric capacitors 17 are formed as many as the MOS transistors.

Figure 2G:
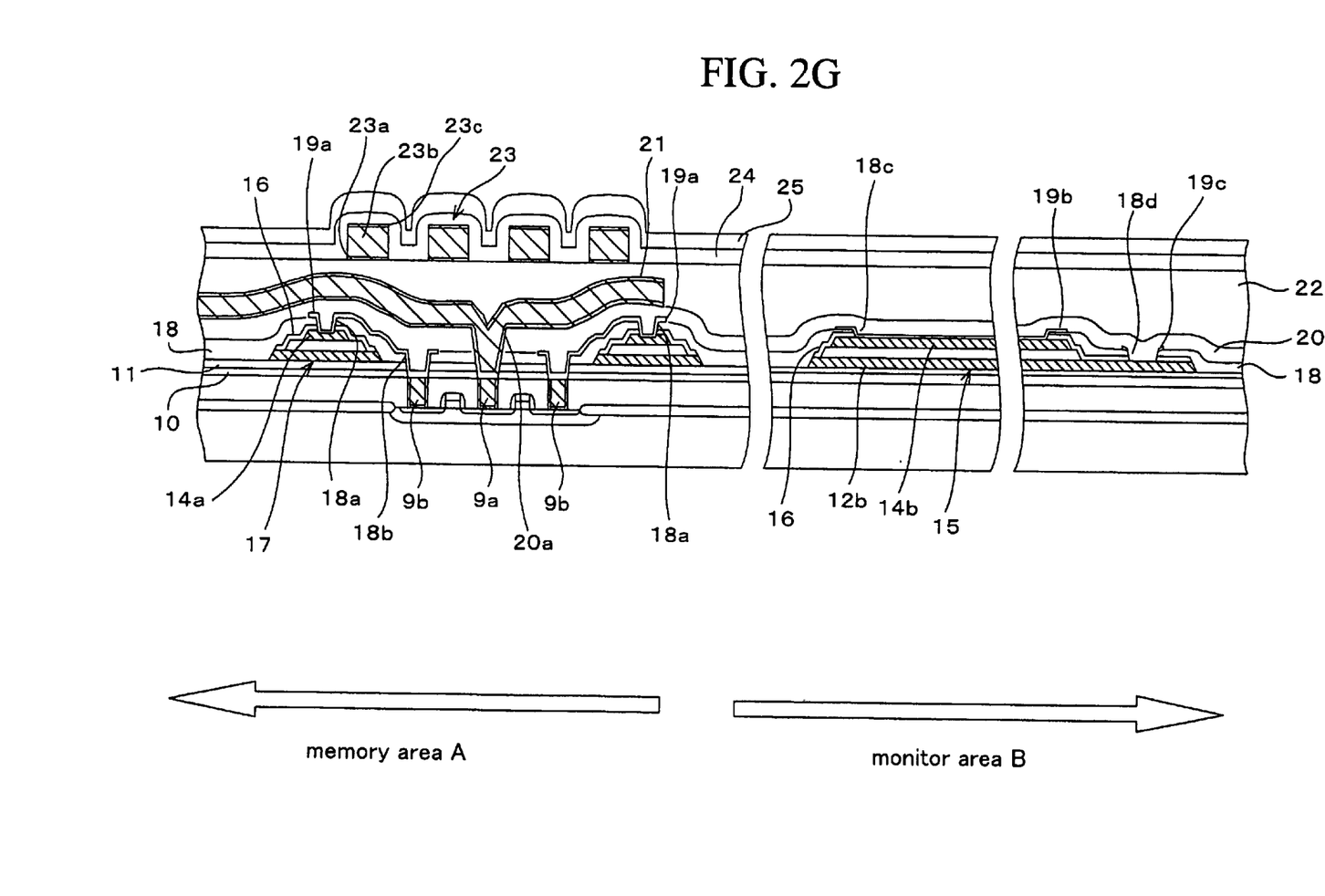

Next, steps required until a formation of a structure shown in FIG. 2G, i.e. the wiring step, will be explained hereunder.

First, the overall surface is subject thereon to a formation of a second interlayer insulating film 18 having a double-layered structure made of a TEOS film and a SOG (Spin-On-Glass) film and having a thickness of 300 nm so as to cover the ferroelectric capacitors 17.

Then, contact holes 18a are formed on the upper electrodes 14a of the ferroelectric capacitors 17 by patterning the second interlayer insulating film 18 and the protection insulating film 16 by the photolithography method.

Also, contact holes 18b are formed on the second contact plugs 9b near both ends of the first p-well 3 in the memory area A by patterning the second interlayer insulating film 18, the protection insulating film 16, the SiON film 10, and the $SiO_2$ film 11 by the photolithography method. In addition, contact holes 18c, 18d are formed in the second interlayer insulating film 18 and the protection insulating film 16 on the second electrode 14b and the first electrode 12b of the dielectric monitor 15 respectively.

The second interlayer insulating film 18 is etched under the conditions that Ar, $CF_4$, and $C_4F_8$ are introduced into the etching atmosphere at 618 sccm, 67 sccm, and 32 sccm respectively, the pressure of the atmosphere is 350 mTorr, the RF electric power is set to 1 kW, and the etching time is set to 26 second. Also, the protection insulating film 16 is etched under the conditions that Ar, $CHF_3$, and $CF_4$ are introduced into the etching atmosphere at 596 sccm, 16 sccm, and 24 sccm respectively, the pressure of the atmosphere is 1000 mTorr, the RF electric power is set to 900 W, and the etching time is set to 22 second. In addition, the $SiO_2$ film 11 and the SiON film 10 is etched under the conditions that Ar, $CF_4$, and $C_4F_8$ are introduced into the etching atmosphere at 618 sccm, 67 sccm, and 32 sccm respectively, the pressure of the atmosphere is 350 mTorr, the RF electric power is set to 1 kW, and the etching time is set to 60 second.

Then, a TiN film of 125 nm thickness, for example, is formed on the second interlayer insulating film 18 and in the contact holes 18a to 18d by the sputter method. Then, the TiN film is patterned by the photolithography method to form, in the memory area A, first local wirings 19a which connect electrically the second contact plugs 9b located near both ends of the first p-well 3 and the upper electrodes 14a via the contact holes 18a, 18b, as shown in FIG. 2G. At the same time, the patterning results in a formation of a second local wiring 19b that is extended to the periphery of the upper electrode 14b via the contact hole 18c on the upper electrode 14b of the dielectric monitor 15, and also it results in a formation of a third local wiring 19c that is extended to the periphery of the lower electrode 12b via the contact hole 18d on the first electrode 12b of the dielectric monitor 15.

In this case, the first local wirings 19a are first-layer metal wirings.

Then, a protection insulating film made of alumina is formed to have a thickness of 15 to 100 nm, and covers all surfaces of the first to third local wirings 19a to 19c and the second interlayer insulating film 18. The protection insulating film can improve an imprint rate of the ferroelectric capacitor 17 as its film thickness is increased thicker. However, it sometimes brings about a difficulty of the etching containing the post-process, for forming the contact holes in the protection insulating film to connect a second-layer metal wiring described later and the substrate. In this case, it is preferable that a film thickness of the protection insulating film should be set to about 20 nm.

Then, the protection insulating film is thereon subject to a formation of an interlayer insulating film made of $SiO_2$ and having a thickness of 200 to 400 nm by the plasma enhanced CVD method using TEOS. Then, a surface layer of the interlayer insulating film is heated at 350° C. in the atmosphere containing $N_2O$. In FIG. 2G, the above insulating film having two layers is called a third interlayer insulating film and is denoted by a reference 20.

Then, respective films from the third interlayer insulating film 20 to the SiON film 10 in the memory area A are patterned by the photolithography method using a resist pattern (not shown). Thus, a hole 20a is formed on the first contact plug 9a in the middle position of the first p-well 3.

The hole 20a to be formed in the third interlayer insulating film 20 and underlying films is formed by the step etching while using the same dry etching equipment.

For example, the interlayer insulating film of the third interlayer insulating film 20 is etched under the conditions that Ar, $CF_4$, and $C_4F_8$ are introduced into the etching atmosphere at 618 sccm, 67 sccm, and 32 sccm respectively, the pressure of the atmosphere is 350 mTorr, the RF electric power is set to 1 kW, and the etching time is set to 26 second. Also, the protection insulating film of the third interlayer insulating film 20 is etched under the conditions that Ar, $CHF_3$, and $CF_4$ are introduced into the etching atmosphere at 596 sccm, 16 sccm, and 24 sccm respectively, the pressure of the atmosphere is 1000 mTorr, the RF electric power is set to 900 kW, and the etching time is set to 22 second. In addition, the second interlayer insulating film 18, the SiON film 10, and the $SiO_2$ film 11 are etched under the conditions that Ar, $CF_4$, and $C_4F_8$ are introduced into the etching atmosphere at 618 sccm, 67 sccm, and 32 sccm respectively, the pressure of the atmosphere is 350 mTorr, the RF electric power is set to 1 kW, and the etching time is set to 60 second.

Then, the third interlayer insulating film 20 and the contact hole 20a are subject thereon and therein to a formation of a metal film having a quintuple-layered structure consisting of a Ti film of 20 nm thickness, a TiN film of 50 nm thickness, an Al-Cu film of 500 nm thickness, a Ti film of 5 nm thickness, and a TiN film of 150 nm thickness. Then, this metal film is patterned by the photolithography method.

Thus, a bit line 21 is formed in the memory area A. Then, the bit line 21 in the memory area A is connected to the first contact plug 9a on the first p-well 3 via the hole 20a. The bit line 21 becomes a second-layer metal wiring.

Then, a fourth interlayer insulating film 22 made of $SiO_2$ and having a thickness of 2.0 $\mu$m is formed on the third interlayer insulating film 20, the bit line 21, and the like by the plasma enhanced CVD method using a TEOS gas and an oxygen ($O_2$) gas.

Then, an upper surface of the fourth interlayer insulating film 22 is polished by the CMP method to planarize.

Then, the silicon substrate 1 is put in the low-pressure atmosphere, then a $N_2O$ gas and a $N_2$ gas are plasmanized in the atmosphere, and then the fourth interlayer insulating film 22 is exposed to the plasma at the substrate temperature of less tan 450° C., for example, 350° C. for 3 minute or more, preferably 4 minute or more. Thus, the plasma treatment results in exhausting to the outside the moisture that permeated into the fourth interlayer insulating film 22 at the time of polishing, and the fourth interlayer insulating film 22 is brought into the state that the moisture is hard to permeate into the film.

In this case, if a cavity is generated in the fourth interlayer insulating film 22, sometimes such cavity is exposed by the polishing. At that time, a cap layer (not shown) made of $SiO_2$ and having a thickness of more than 100 nm may be formed as an upper layer portion of the fourth interlayer insulating film 22 after the polishing. The cap layer is formed by the plasma enhanced CVD method using the TEOS gas and then is exposed to the $N_2O$ plasma at the substrate temperature of 350° C.

Then, a TiN film 23a is formed on an upper surface of the fourth interlayer insulating film 22 by the sputter. Then, the TiN film 23a is sequentially subject thereon to a formation of an Al-Cu film 23b of 600 nm thickness and a TiN film 23c of 100 nm thickness.

Then, a wiring 23 is formed by patterning the TiN film 23c, the Al-Cu film 23b, and the TiN film 23a. In this case, the wiring 23 is a third-layer metal wiring.

After the above formation of the wiring 23, a first cover insulating film 24 made of $SiO_2$ and having a thickness of 200 nm, for example, is formed by the plasma enhanced CVD method using TEOS so as to cover the third-layer metal wiring 23. Then, the first cover insulating film 24 is subject thereon to a formation of a second cover insulating film 25 made of silicon nitride and having a thickness of 500 nm, for example, by the plasma enhanced CVD method using silane and ammonium.

The above steps lead to a completion of a basic structure of FeRAM having the ferroelectric capacitor 17.

In this case, the material is not limited to alumina with respect to constituent material of the protection insulating film 16 or the protection insulating film of the third interlayer insulating film 20. It may be the insulating material such as PZT, $TiO_2$, AlN, $Si_3N_4$, SiON, etc., which is hard to permeate the hydrogen.

Then, the monitor test and the device test are executed successively in the wafer state, and then the delivery decision is made in accordance with predetermined criteria.

The monitor test is performed by using the cell test pattern and measuring transistor characteristics, contact resistance, wiring resistance, inter-wiring leakage, ferroelectric capacitor characteristics, etc. The wafer is defined as the non-defective if these measured values are within the criteria, while the wafer is defined as the defective if these measured values are out of the criteria. The resultant procedure abandons or reproduces the wafers defined as the defective.

As the monitor for measuring the ferroelectric capacitor characteristics out of the above measurement items, there is employed the cell test pattern connecting in parallel a plurality of capacitors each having the same shape as the capacitor in the memory cell. The cell test pattern brings about measured values of the ferroelectric capacitor characteristics such as an amount of residual dielectric polarization ($Q_{SW}$), an amount of effective residual dielectric polarization ($Q_{eff}$), saturation voltage (V90), capacitor leakage current ($L_{cap}$), capacitor capacitance ($C_{cap}$), etc.

The device test is composed of the direct current test for measuring operation states of the input protection circuit, the alternating current test for measuring operation states of peripheral circuits and all the cells, and the retention test for checking whether or not data of the ferroelectric capacitor can be held. The test results are evaluated in accordance with predetermined criteria to define whether or not the wafer is the non-defective or the defective. The resultant procedure abandons or reproduces the wafers that are decided as the defective.

According to the above embodiment, in the steps of forming the capacitor 17 and the dielectric monitor 15 in parallel, the characteristics of the dielectric monitor 15 are measured after the capacitor dielectric film 13a of the capacitor 17 is formed by patterning the dielectric film 13 and before the first conductive film 12 is patterned, and then the capacitor 17 is evaluated based on measured results of the characteristics of the dielectric monitor 15.

Since the characteristics of the dielectric monitor 15 are measured in the midway to completion of the capacitor 17, abnormality of the crystallinity or composition of the dielectric film 13 can be detected via the measured value of an amount of residual dielectric polarization ($Q_{SW}$) in the midway to completion of the capacitor 17. Therefore, the evaluation of the capacitor 17 can be made before the formation of the capacitor 17 is completed, and thus it can be decided in the early stage whether or not the capacitor forming step should be continued, or the concerned wafer should be abandoned, or the step should go back to the step of reproducing the capacitor. As a result, even if the failure is caused during the capacitor forming process, its evaluation leads to an elimination of wasteful man-hours in the manufacturing steps subsequent to the relevant step in which the failure is caused, and thus improvement in throughput can be achieved. Also, if the reproduction is selected, merely the defective capacitor forming step is required as a reproducing operation, and thus the reproducing operation can be simplified and also improvement in yield can be achieved.

Also, yield of the retention characteristic of the capacitor 17 can be predicted via the measured value of an amount of residual dielectric polarization ($Q_{SW}$). Therefore, only the in-process wafers with high yield can be shifted selectively to later steps, and thus it can lead to improvement in device yield.

Explanation of Measurement Items and Evaluation Items That can be Evaluated by the Measurement Items)

Next, an explanation will describe in detail hereunder examined results of measurement items of the dielectric monitor and capacitor evaluation items that can be evaluated by the measurement items, in the capacitor evaluation method applied to the above semiconductor memory device manufacturing method.

Figure 5:
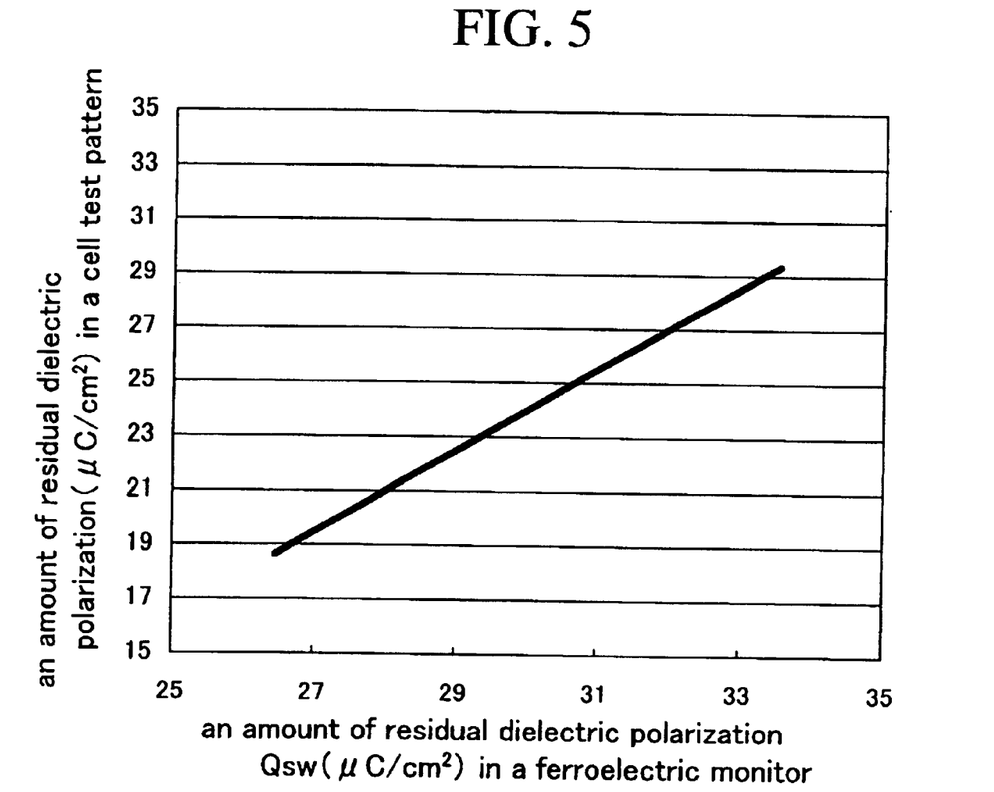
FIG. 5 is a graph showing a correlation between an amount of residual dielectric polarization in the dielectric monitor and an amount of residual dielectric polarization in a cell test pattern according to the semiconductor memory device of the embodiment of the present invention.

FIG. 5 is a graph showing a correlation between an amount of residual dielectric polarization ($Q_{SW}$) in the dielectric monitor and an amount of residual dielectric polarization ($Q_{SW}$) in the cell test pattern. An ordinate of FIG. 5 denotes an amount of residual dielectric polarization ($\mu C/cm^2$) in the cell test pattern in a linear scale, and an abscissa thereof denotes an amount of residual dielectric polarization ($\mu C/cm^2$) in the dielectric monitor in a linear scale.

The dielectric monitor corresponds to the monitor having the structure shown in FIG. 4B, and materials of the electrodes and the dielectric film corresponds to materials explained in the semiconductor memory device manufacturing method. Also, the cell test pattern corresponds to the test pattern connecting in parallel a plurality of dielectric capacitors each having the same shape as the capacitor in the memory area, as shown in FIG. 4A. The material of the electrodes and the dielectric film in the cell test pattern corresponds to same material as the material of the dielectric monitor. Also, the measuring circuit for an amount of residual dielectric polarization ($Q_{SW}$) corresponds to the already explained sawyer-tower circuit.

According to the results shown in FIG. 5, there is a strong correlation between an amount of residual dielectric polarization ($Q_{SW}$) in the dielectric monitor and an amount of residual dielectric polarization ($Q_{SW}$) in the cell test pattern. Since it may be considered that an amount of residual dielectric polarization ($Q_{SW}$) in the cell test pattern corresponds substantially to an amount of residual dielectric polarization ($Q_{SW}$) in the capacitor in the memory area, such amount of residual dielectric polarization ($Q_{SW}$) in the capacitor in the memory area can be evaluated by measuring an amount of residual dielectric polarization ($Q_{SW}$) in the dielectric monitor. An evaluation of an amount of residual dielectric polarization ($Q_{SW}$) in the capacitor is performed on the basis of 1)setting a lower limit of such amount of residual dielectric polarization ($Q_{SW}$) in the capacitor, which allows the delivery of the device; 2)setting an amount of residual dielectric polarization ($Q_{SW}$) in the dielectric monitor, which corresponds to such lower limit based on FIG. 5; 3)setting a lower limit of the delivery criterion corresponding to the set value of $Q_{SW}$ from above 2) term.

Figure 6:
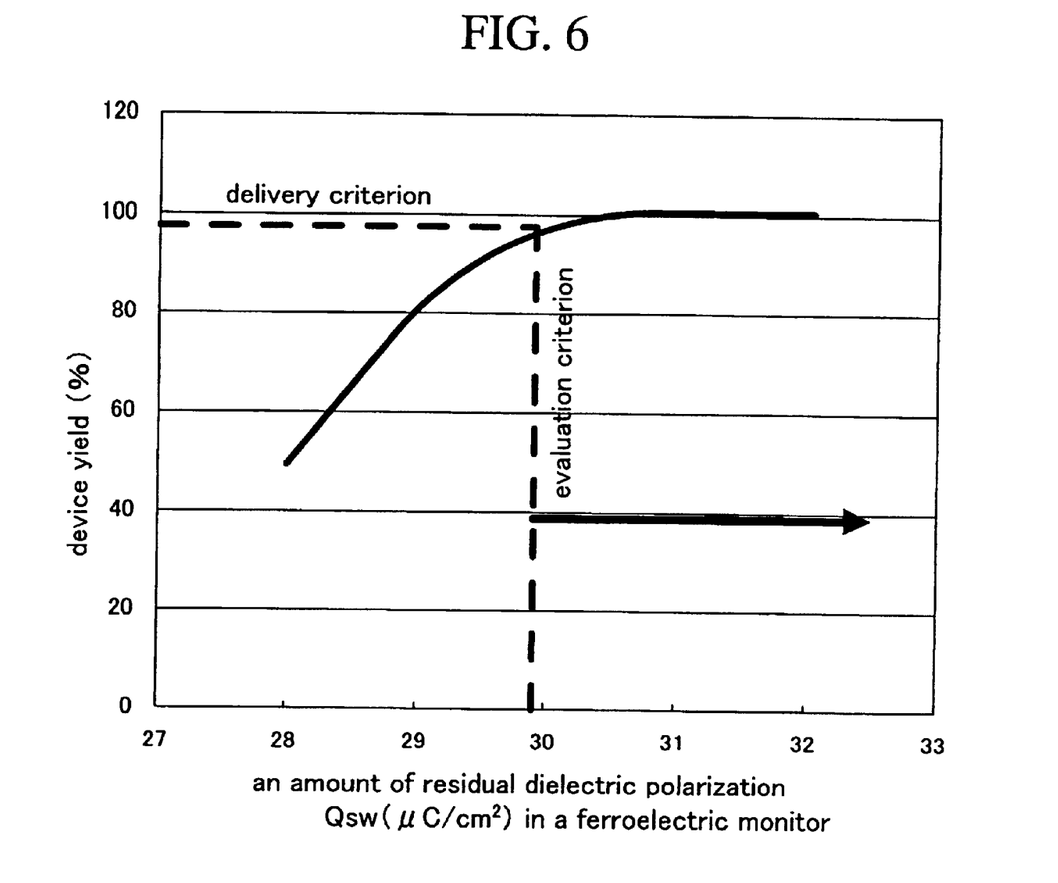
FIG. 6 is a graph showing a correlation between an amount of residual dielectric polarization in the dielectric monitor and retention yield of the cell test pattern according to the semiconductor memory device of the embodiment of the present invention.

FIG. 6 is a graph showing a correlation between an amount of residual dielectric polarization ($Q_{SW}$) in the dielectric monitor and device yield based on the cell test pattern. An ordinate of FIG. 6 denotes device yield (%) based on the cell test pattern in a linear scale, and an abscissa thereof denotes an amount of residual dielectric polarization ($\mu C/cm^2$) in the dielectric monitor in a linear scale. In this case, the device yield based on the cell test pattern means yield of retention (data retention characteristic) of the cell test pattern. In order to acquire the data corresponding to a wide range of the yield value, samples were prepared by changing variously the manufacturing conditions, etc.

The shapes and the material of the dielectric monitor and the cell test pattern corresponds to the shapes and the material that are similar to these shown in FIG. 5. Also, the measuring circuit for an amount of residual dielectric polarization ($Q_{SW}$) and the retention corresponds to the already-explained sawyer-tower circuit.

According to the results shown in FIG. 6, there is a strong correlation between an amount of residual dielectric polarization ($Q_{SW}$) in the dielectric monitor and yield of the retention of the cell test pattern. It is considered that the yield of the retention of the cell test pattern corresponds substantially to yield of the retention of the capacitor in the memory area. For this reason, measurement of an amount of residual dielectric polarization ($Q_{SW}$) in the dielectric monitor can lead to the yield of the retention of the capacitor in the memory area.

As an example of the evaluation criterion for the yield of the retention, a lower limit of the criterion applied to an amount of residual dielectric polarization ($Q_{SW}$) in the dielectric monitor can be set to 30 $\mu C/cm^2$ if the retention yield of 95% is set as the lower limit that allows the delivery.

With the above, the embodiment of the present invention is explained in detail with reference to the drawings. But the particular configuration is not limited to this embodiment, and design change, etc. in the scope that does not depart from the gist of the present invention may be contained in the present invention.

For example, in the above embodiment, the dielectric monitor 15 is formed directly on the $SiO_2$ film 11 over the semiconductor substrate. But a third conductive film may be interposed between the $SiO_2$ film 11 and the first conductive film 12. In this case, the first conductive film 12 is patterned to form the capacitor 17 that has the lower electrode 12a of the patterned first conductive film directly on the $SiO_2$ film 11, and also to form the dielectric monitor 15 that has the first electrode 12b of the patterned first conductive film on the third conductive film. In this case, the third conductive film is formed to be exposed around the dielectric monitor 15 and thus the simplified monitor test is executed by using this third conductive film.

If doing this, since the characteristics of the dielectric monitor 15 are measured immediately after the formation of the capacitor 17, the abnormality of crystallinity and composition of the dielectric film 13 can be detected via the measured value of the amount of residual dielectric polarization ($Q_{SW}$) and therefore the evaluation of the capacitor 17 can be made in the early stage before the manufacturing step is shifted to a process next to the process of forming the capacitor 17. The performance results in the same advantages as those in the above embodiment.

Also, in the above embodiment, the semiconductor memory device manufacturing method of the present invention is applied to the FeRAM manufacturing method. But the present invention may be applied to the manufacturing method of a semiconductor memory device having DRAM or other capacitor.

In addition, in the above embodiment, an amount of residual dielectric polarization ($Q_{SW}$) is selected as the measurement item of the dielectric monitor and also an amount of residual dielectric polarization ($Q_{SW}$) and the retention yield are selected as the evaluation items of the capacitor. But the measurement items may include an amount of effective residual dielectric polarization ($Q_{eff}$), saturation voltage (V90), capacitor leakage current ($L_{cap}$), or capacitor capacitance ($C_{cap}$), in addition to an amount of residual dielectric polarization ($Q_{SW}$). Also, the measurement items may include the hysteresis characteristic, the dielectric constant, or the like of the monitor dielectric film 13b. The evaluation items that can be evaluated by the measurement items may include items that correspond to respective measurement items, the fatigue (fatigue characteristic), or the like, in addition to an amount of residual dielectric polarization ($Q_{SW}$) and the retention yield.

In the simplified monitor test, these measurement items may be solely or in combination. A precision of the simplified monitor test can be improved much more by employing these measurement items in combination.

As described above, according to the present invention, the capacitor and the dielectric monitor are formed in parallel, and then the characteristics of the dielectric monitor is measured in the midway to completion of the capacitor, and then the capacitor is evaluated based on measured results of the characteristics of the dielectric monitor.

Since the characteristics of the dielectric monitor are measured in the midway to completion of the capacitor, the abnormality of crystallinity, composition, etc. of the dielectric film can be detected via the measured value of the capacitor characteristics such as the amount of residual dielectric polarization ($Q_{SW}$), etc. in the midway to completion of the capacitor. Therefore, before the formation of the capacitor is completed, the evaluation of the capacitor can be made to decide in the early stage whether or not the capacitor forming step should be continued, or the concerned wafer should be abandoned, or the step should go back to the step of reproducing the capacitor. In this manner, even if the failure is caused in the capacitor forming step, the performance can lead to an elimination of wasteful man-hours in the manufacturing steps subsequent to the relevant step in which the failure is caused, and thus improvement in throughput can be achieved. In addition, if the reproduction is selected, merely the defective manufacturing step is required as the reproducing operation, and thus the reproducing operation can be simplified and also improvement in yield can be achieved.

Also, the yield of the retention, etc. of the capacitor can be predicted via the measured values of the capacitor characteristics such as an amount of residual dielectric polarization ($Q_{SW}$), etc. Therefore, only the in-process wafers with high yield can be shifted selectively to later steps, and thus improvement in the device yield can be achieved.

What is claimed is:

1. A method of manufacturing a semiconductor memory device provided with a capacitor over a semiconductor substrate, which has a laminated structure of a lower electrode made of a first conductive film, a capacitor dielectric film made of a dielectric film, and an upper electrode made of a second conductive film, comprising the steps of:

forming an insulating film over the semiconductor substrate;

forming a capacitor on the insulating film;

forming a dielectric monitor, which is made of same material and has a same layer structure as the capacitor, on the insulating film;

measuring characteristics of the dielectric monitor in the middle of a process of forming the capacitor; and evaluating the capacitor based on measured results of the characteristics of the dielectric monitor.

2. A method according to claim 1, wherein the first conductive film not-patterned serves as a first electrode of the dielectric monitor, the dielectric film patterned serves as a monitor dielectric film thereof, and the second conductive film patterned serves as a second electrode thereof.

3. A method according to claim 2, wherein the step of forming the dielectric monitor includes the steps of, forming the second electrode by patterning the second conductive film out of the first conductive film, the dielectric film, and the second conductive film, which are laminated on the insulating film, and forming the monitor dielectric film by patterning the dielectric film.

4. A method according to claim 3, wherein the step of measuring the characteristics of the dielectric monitor is executed after the step of forming the monitor dielectric film by patterning the dielectric film and before the step of patterning the first conductive film.

5. A method according to claim 2, wherein, in the step of measuring the characteristics of the dielectric monitor, measuring pads are the first conductive film and the second electrode.

6. A method according to claim 5, wherein, in the step of measuring the characteristics of the dielectric monitor, the characteristics of the dielectric monitor are measured by bringing needle-like electrodes into contact with the first conductive film and the second electrode respectively.

7. A method according to claim 1, wherein, if evaluated results of the capacitor satisfy predetermined criteria, a capacitor lower electrode is formed by patterning not-patterned first conductive film after the step of evaluating the capacitor, whereby the capacitor is formed.

8. A method according to claim 7, after the capacitor is formed, further comprising the steps of:

forming an insulating film for covering the capacitor; and forming a wiring on the insulating film that covers the capacitor.

9. A method according to claim 1, wherein, if evaluated results of the capacitor do not satisfy predetermined criteria, after the step of evaluating the capacitor, one operation is elected from the group consisting of a first operation of abandoning the semiconductor substrate having the dielectric monitor, and executing over steps again from a first step by using a new semiconductor substrate, and a second operation of removing the upper electrode and the dielectric film of the capacitor, and the second electrode and the monitor dielectric film of the dielectric monitor, and then forming a new dielectric film and a new second conductive film on non-patterned first conductive film.

10. A method according to claim 1, wherein the semiconductor substrate is a semiconductor wafer on which a plurality of chips are formed, the capacitor is formed in a memory area in each chip, and the dielectric monitor is formed in a dicing area used to separate the wafer into every chip or in a monitor area as a corner area of each chip.

11. A method according to claim 1, wherein, in the step of measuring characteristics of the dielectric monitor, the measurement is performed with respect to at least any one of an amount of residual dielectric polarization, a dielectric constant, and hysteresis of the dielectric film.

12. A method according to claim 1, wherein the semiconductor substrate has an insulated-gate field effect transistor.

13. A method according to claim 1, wherein the dielectric film is made of ferroelectric material.

14. A method according to claim 1, wherein a shape of the dielectric monitor is different from a shape of the capacitor.

15. A method of manufacturing a semiconductor memory device provided with a capacitor over a semiconductor substrate, which has a lamination of a lower electrode made of a first conductive film, a capacitor dielectric film made of a dielectric film, and an upper electrode made of a second conductive film, comprising the steps of:

forming an insulating film over the semiconductor substrate;

forming selectively a third conductive film on the insulating film;

laminating sequentially the first conductive film, the dielectric film, and the second conductive film on the insulating film and the third conductive film;

forming the capacitor, which has the upper electrode, the dielectric film, and the lower electrode, on the insulating film by patterning the second conductive film, the dielectric film, and the first conductive film, and also forming a dielectric monitor, which has a patterned second conductive film as a second electrode, a patterned dielectric film as a monitor dielectric film, and a patterned first conductive film as a first electrode, on the third conductive film to expose the third conductive film around the dielectric monitor;

measuring characteristics of the dielectric monitor; and evaluating the capacitor based on measured results of the characteristics of the dielectric monitor.

16. A method according to claim 15, wherein, in the step of measuring the characteristics of the dielectric monitor, measuring pads are the third conductive film and the second electrode.

17. A method according to claim 16, wherein, in the step of measuring the characteristics of the dielectric monitor, the characteristics of the dielectric monitor are measured by bringing needle-like electrodes into contact with the third conductive film and the second electrode respectively.

18. A method according to claim 15, if evaluated results of the capacitor satisfy predetermined criteria, further comprising the steps of:

forming an insulating film for covering the capacitor; and forming a wiring on the insulating film that covers the capacitor, after the step of evaluating the capacitor.

19. A method according to claim 15, wherein, if evaluated results of the capacitor do not satisfy predetermined criteria, after the step of evaluating the capacitor, one operation is elected from the group of consisting of a first operation of abandoning the semiconductor substrate having the dielectric monitor and executing over steps again from a first step by using a new semiconductor substrate, and a second operation of removing the upper electrode, the dielectric film, and the lower electrode of the capacitor and the second electrode, the monitor dielectric film, and the first electrode of the dielectric monitor, and then forming a first conductive film, a dielectric film, and a second conductive film newly on the insulating film.

20. A method according to claim 15, wherein the semiconductor substrate is a semiconductor wafer on which a plurality of chips are formed, the capacitor is formed in a memory area in each chip, and the dielectric monitor is formed in a dicing area used to separate the wafer into every chip or in a monitor area as a corner area of each chip.

21. A method according to claim 15, wherein, in the step of measuring characteristics of the dielectric monitor, the measurement is performed with respect to at least any one of an amount of residual dielectric polarization, a dielectric constant, and hysteresis of the dielectric film.

22. A method according to claim 15, wherein the semiconductor substrate has an insulated-gate field effect transistor.

23. A method according to claim 15, wherein the dielectric film is made of ferroelectric material.

24. A method according to claim 15, wherein a shape of the dielectric monitor is different from a shape of the capacitor.

* * * * *